US011114628B2

(12) United States Patent
Jin

(10) Patent No.: US 11,114,628 B2
(45) Date of Patent: Sep. 7, 2021

(54) METHOD OF MANUFACTURING A FLEXIBLE ORGANIC LIGHT-EMITTING DIODE (OLED) DISPLAY PANEL BY LASER LIFT-OFF OF A GLASS CARRIER THROUGH A PLANARIZATION LAYER

(71) Applicant: Wuhan China Star Optoelectronics Semiconductor Display Technology Co., Ltd., Hubei (CN)

(72) Inventor: Xiang Jin, Guangdong (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 15/916,470

(22) Filed: Mar. 9, 2018

(65) Prior Publication Data

US 2019/0173029 A1   Jun. 6, 2019

Related U.S. Application Data

(63) Continuation of application No. PCT/CN2018/071589, filed on Jan. 5, 2018.

(30) Foreign Application Priority Data

Dec. 5, 2017   (CN) .......................... 201711269186.0

(51) Int. Cl.
*H01L 51/00* (2006.01)
*H01L 51/50* (2006.01)
(Continued)

(52) U.S. Cl.
CPC ........ *H01L 51/0097* (2013.01); *G06F 3/0412* (2013.01); *H01L 27/3262* (2013.01);
(Continued)

(58) Field of Classification Search
CPC ............ H01L 51/0016; H01L 51/0097; H01L 51/5096; H01L 51/5206; H01L 51/5221;
(Continued)

(56) References Cited

U.S. PATENT DOCUMENTS

| 6,784,009 B2 * | 8/2004 | Lim | H01L 27/3283 438/24 |
| 2003/0096446 A1 * | 5/2003 | Lim | H01L 27/3283 438/99 |
| 2017/0345849 A1 | 11/2017 | Kinoshita et al. | |

FOREIGN PATENT DOCUMENTS

| CN | 102569347 A | 7/2012 |
| CN | 103311455 A | 9/2013 |

(Continued)

OTHER PUBLICATIONS

Office Action dated Dec. 20, 2018 from corresponding application No. CN 201711269186.0.

*Primary Examiner* — Andrew Q Tran
(74) *Attorney, Agent, or Firm* — Hemisphere Law, PLLC; Zhigang Ma

(57) ABSTRACT

A method of manufacturing flexible OLED display panel is provided. The method comprises following steps. Providing a glass carrier, sequentially forming a flexible substrate, a low temperature poly-Si layer and OLED element layer on a surface of the glass carrier; forming a planar layer on a second surface of the glass carrier which is away from the flexible substrate and obtaining a planning OLED display panel; removing the glass carrier by laser lift-off the planning OLED display panel and obtaining the flexible OLED display panel. The method could reduce the problem of lower peeling successful rate caused by the unevenly distributing in the flexible substrate during the laser lift-off process.

18 Claims, 3 Drawing Sheets

(51) Int. Cl.

| | |
|---|---|
| *H01L 51/52* | (2006.01) |
| *H01L 51/56* | (2006.01) |
| *G06F 3/041* | (2006.01) |
| *H01L 27/32* | (2006.01) |

(52) U.S. Cl.
CPC ........ *H01L 51/003* (2013.01); *H01L 51/0016* (2013.01); *H01L 51/5096* (2013.01); *H01L 51/5206* (2013.01); *H01L 51/5221* (2013.01); *H01L 51/56* (2013.01); *H01L 2251/5338* (2013.01)

(58) Field of Classification Search
CPC ............. H01L 51/56; H01L 2251/5338; H01L 27/3262; H01L 27/3251; G06F 3/0412
See application file for complete search history.

(56) References Cited

FOREIGN PATENT DOCUMENTS

| | | | |
|---|---|---|---|
| CN | 105024017 | A | 11/2015 |
| CN | 105789243 | A | 7/2016 |
| CN | 106338852 | A | 1/2017 |
| CN | 106449711 | A | 2/2017 |

\* cited by examiner

Laser too strong                Laser not strong enough

METHOD OF MANUFACTURING A FLEXIBLE ORGANIC LIGHT-EMITTING DIODE (OLED) DISPLAY PANEL BY LASER LIFT-OFF OF A GLASS CARRIER THROUGH A PLANARIZATION LAYER

RELATED APPLICATIONS

This application is a continuation application of PCT Patent Application No. PCT/CN2018/071589, filed Jan. 5, 2018, which claims the priority benefit of Chinese Patent Application No. 201711269186.0, filed Dec. 5, 2017, which is herein incorporated by reference in its entirety.

FIELD OF THE DISCLOSURE

The disclosure relates to an OLED display technical field, and more particularly to a method of manufacturing a flexible OLED display panel.

BACKGROUND

The OLED (Organic Light-Emitting Diodes) is a self-luminous element. It has some advantages such as light, low consumption, fast response, high luminescence efficiency and achievement of flexible display, such that became widely using display element for recent years. Wherein, the flexible OLED display panel became the mainstream product of currently display field.

While manufacturing a flexible OLED display panel, the laser lift-off (LLO) process is very important, this process is for separating a glass carrier from a flexile substrate of the pane, so as achieve to make the rigid panel flexible. The panel generally comprises a glass carrier and a flexible substrate (for preparing a touch circuit) thereon, a low temperature poly-Si, and an OLED element layer (please refer to FIG. 1). The principle of LLO process is that using the laser passing through the glass carrier and modify the flexible substrate (ex: PI) and separate to the glass. But the mechanism damage (such as pits or cracks) on the glass carrier will affect the evenly distributing of laser in the PI, and cause failure separate the PI and carrier, cause damage of OLED element, decreases yield. Please refer to FIG. 2, on the region has more laser distribution, many ashes produced of PI by laser burning, it may damage the circuit and TFT of the PI substrate; on the region has less laser distribution, PI can't absorb enough laser energy, it is not easy separate to glass, so that PI will pull the wire and TFT while separating process.

Hence, it is necessary to improve method manufacturing the flexible OLED display panel.

SUMMARY

A technical problem to be solved by the disclosure is to provide a method of manufacturing a flexible OLED display panel. It could solve the problem of unevenly distribution laser on flexible substrate during LLO process caused by pits on surface of glass carrier, and enhances successful rate of LLO process.

Furthermore, the disclosure further provides a display device including a method of manufacturing a flexible OLED display panel An objective of the disclosure is achieved by following embodiments. In particular, a method of manufacturing a flexible OLED display panel comprising following steps.

providing a glass carrier, sequentially forming a flexible substrate, a low temperature poly-Si layer and an OLED element layer on a surface of the glass carrier 10;

forming a planarization layer on a surface of the glass carrier which is away from the flexible substrate and obtaining a planarized OLED display panel;

removing the glass carrier by laser lift-off the planarized OLED display panel, and obtaining the flexible OLED display panel.

In an embodiment, the planarization layer has laser transmittance ≥90% in 300-400 nm wavelength range.

In an embodiment, roughness of the planarization layer is Ra≤0.4 µm.

In an embodiment, thickness of the planarization layer is 50-120 µm.

In an embodiment, thickness of the glass carrier is 400-500 µm.

In an embodiment, the planarization layer and the glass carrier which are stacking positioned have laser transmittance ≥40% in 300-400 nm wavelength range.

In an embodiment, the material of the planarization layer comprises at least one of organic material or inorganic material, the organic material comprises at least one of epoxy, acrylic resin and silicone; the inorganic material comprises at least one of silicon dioxide, magnesium fluoride, calcium fluoride and barium fluoride.

In an embodiment, the step of forming the planarization layer which is that mixing the material of the planarization layer and solvent to obtain a sizing mixture; coating the sizing mixture on the surface of the glass carrier which is away from the flexible substrate; and curing to form the planarization layer.

In an embodiment, during the laser lift-off, the laser wavelength is 300-400 nm; the laser energy is 290-350 mJ.

In an embodiment, sequentially forming a packaging protecting layer, a flexible rear cover on the OLED element layer.

The method of manufacturing a flexible OLED display panel of this disclosure. Before laser lift-off processing the OLED display panel which has glass carrier, forming the planarization layer on surface of the glass carrier which is away from the flexible substrate, so that flatting the surface of the glass carrier which is away from the flexible substrate. While the laser lift-off, laser could uniform hitting on the flexible substrate, it is easy to achieve separating the glass carrier and the flexible substrate and won't damage the touch circuit, TFT on the flexible substrate. The method of manufacturing a flexible OLED display panel of this disclosure could better improve the problem of the laser uneven distributing in the flexile substrate because of the surface of glass carrier is damaged by the mechanical during the present LLO process, and enhances successful rate of LLO process, enhances yield product of flexible OLED display panel.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

Label of the figures, 10 is glass carrier, 20 is planarization layer, 1 is flexible substrate, 2 is low temperature ply-Si, 3 is OLED element.

DETAILED DESCRIPTION OF PREFERRED EMBODIMENTS

The specific structural and functional details disclosed herein are only representative and are intended for describing exemplary embodiments of the disclosure. However, the disclosure can be embodied in many forms of substitution, and should not be interpreted as merely limited to the embodiments described herein.

The disclosure will be further described in detail with reference to accompanying drawings and preferred embodiments as follows.

Figure 3:
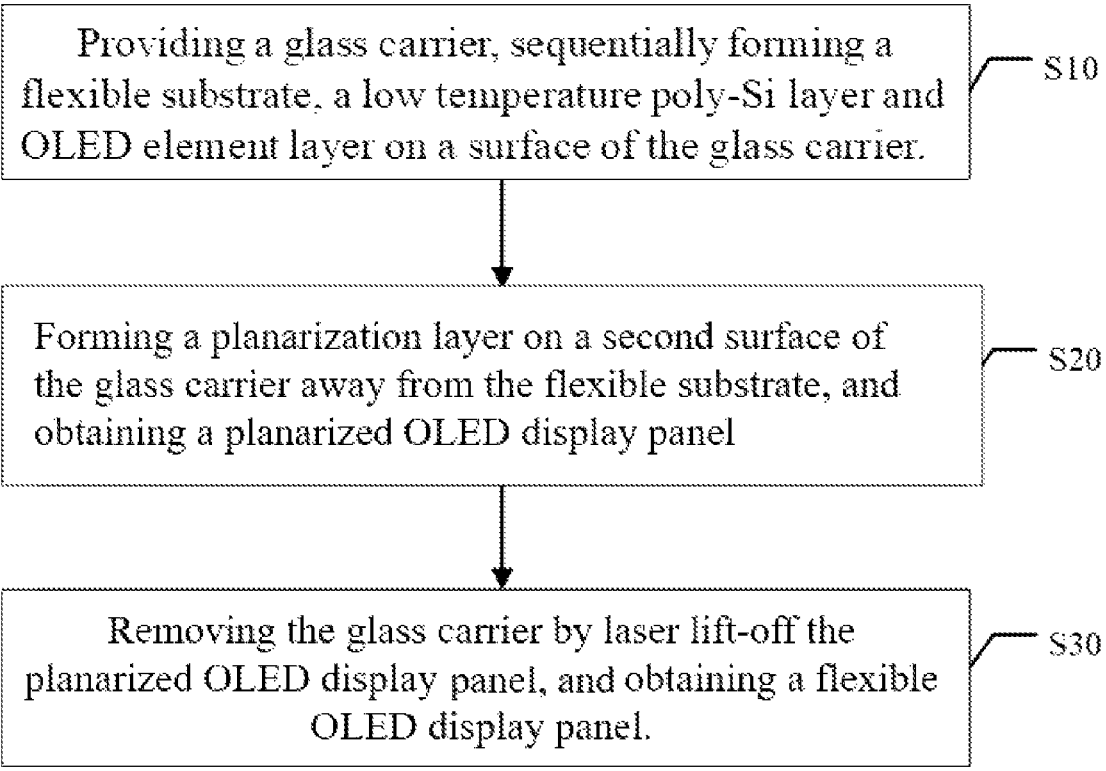
FIG. 3 is a flow chart diagram of a method of manufacturing a flexible OLED display panel according to an embodiment of the disclosure.

Please refer to FIG. 3, a method of manufacturing OLED display panel comprises following steps.

Figure 1:
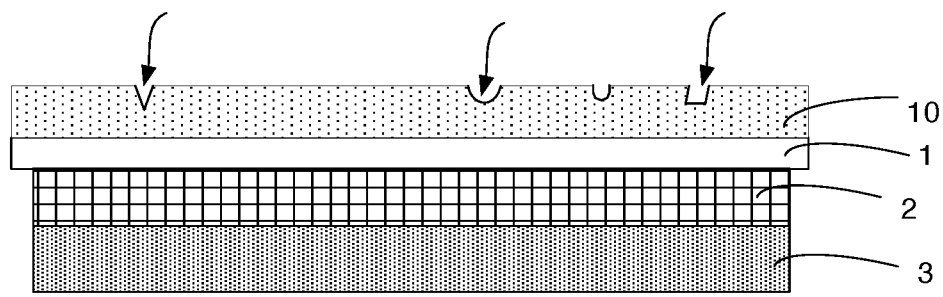
FIG. 1 is a structural schematic view of an OLED display panel before LLO in prior art.
Figure 2:
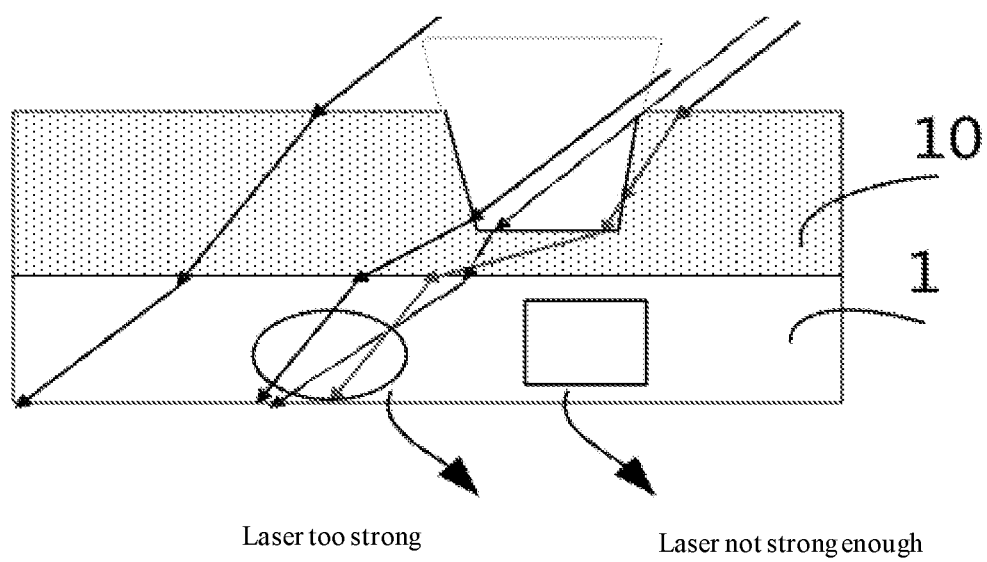
FIG. 2 is a light path of laser in the panel during LLO process in prior art.

S10, providing a glass carrier 10, sequentially forming a flexible substrate 1, a low temperature poly-Si layer 2 and an OLED element layer 3 on a surface of the glass carrier 10, and obtaining the OLED display panel has the glass carrier shows as FIG. 1;

S20, forming a planarization layer 20 on a surface of the glass carrier 10 which is away from the flexible substrate 1 and obtaining a planarized OLED display panel;

S30, removing the glass carrier by laser lift-off the planarized OLED display panel, and obtaining the flexible OLED display panel.

In the step S10, the surface of the glass carrier 10 which is away from the flexible substrate 1 has mechanical damage (such as pits, scratches shown as arrow in FIG. 1). These mechanical damage usually formed by at least one of structures of thimbles, roller and brush or the objects thereon such that causes pits, scratches, while forming the flexible substrate 1, the low temperature poly-Si layer 2 and the OLED element layer 3 on the glass carrier 10, and using the glass carrier 10 to be support and contacting with those objects.

In addition, structure of the OLED display panel has glass carrier is not limited in FIG. 1. It will be described as following steps S300.

In the step S20, purpose of preparing planarization layer 20 is for filling mechanical damage (such as pits, scratches) on the glass carrier 10, and then the surface of the glass carrier 10 which is away from the flexible substrate is planarized. Therefore, it is easy to uniform distributing laser on the flexible substrate while laser lift-off process.

Wherein, the planarization layer 20 has laser transmittance ≥9% in 300-400 nm wavelength range. Preferably, the laser transmittance is ≥95%. The transmittance of the planarization layer 20 is close to the transmittance of the glass carrier 10 such that will not affect the original transmittance of the glass carrier while extra positions a planarization layer 20.

Selectively, the material of the planarization layer has laser absorption rate ≤6% in 300-400 nm wavelength range. Therefore, it will not cause significant attenuation of laser energy of laser lift-off.

Wherein, the roughness of the planarization layer is Ra≤0.4 μm (profile arithmetic average deviation). Wherein, the thickness of the planarization layer is 50-120 μm. The thickness of here is indicates the thickness of the planarization layer 20 of the glass carrier 10 without pits. The thickness of the planarization layer 20 cannot too thick to prevent effect laser passing to nearby the flexible substrate 1.

Selectively, the thickness of the glass carrier 10 is 400-500 μm. The thickness of here is indicates the thickness of the glass carrier 10 without pits.

Selectively, the p planarization layer 20 and the glass carrier 10 which are stacking positioned, and has laser transmittance ≥40% in 300-400 nm wavelength range.

The material of the planarization layer 20 comprises at least one of organic material or inorganic material. Specifically, the inorganic material for example silicon dioxide ($SiO_2$), magnesium fluoride ($MgF_2$), calcium fluoride ($CaF_2$) and barium fluoride ($BaF_2$) and so on.

The organic material for example acrylic resin (ex, polymethyl methacrylate (PMMA)), epoxy and organic silicone and so on. For example, the planarization layer is an organic silicone is copolymerization by polydimethylsiloxane (PDMS), acrylate and silane coupling agent (ex, VinylMethoxysiloxane). The planarization layer also could be organic silicone formed by bisphenol A epoxy acrylate resin, KH-57 silane coupling agent (γ-methacryloxy propyl trimethoxyl silane) and dibenzoyl peroxide (BPO) initiator crosslinking and solidation.

Selectively, the organic material better not contains aromatic ring, hydroxyl group, amino group, halogen, sulfur group. Therefore, it could avoid these structures have high absorption of UV light and lower transmittance. It could adjust the molecular chain, group of the organic material to change optical property such that let the material has high transmittance and low absorption close to the glass.

Preferably, the material of the planarization layer 20 is $SiO_2$.

The planarization layer 20 is achieves by coating method, chemical vapor deposition. It could choose by the material, prefer to prepare by the coating method such that could better to fill mechanical damage (such as pits, scratches) on the glass carrier 10

Specifically, the step of forming the planarization layer 20 which is mixing the material of the planarization layer 20 and the solvent to obtain a sizing mixture; coating the sizing mixture on the surface of the glass carrier 10 which is away from the flexible substrate; and curing to form the planarization layer 20.

Wherein, the solvent is selective from one or more normal chemical solvent such as water, ethanol, isopropyl, propanol, butanone and benzene, but here is not limited thereto. The specifically selective way of solvent is according to the dissolvability of the material of planarization layer 20. For example, while choose the $SiO_2$ or $MgF_2$ to be material of planarization layer 20, it could be using the water to be solvent and forming the sizing mixture; while using the PMMA to be the material of the planarization layer 20, it could be using volatile solvent such of propanol, chloroform, dichloromethane and forming the sizing mixture.

Figure 4:
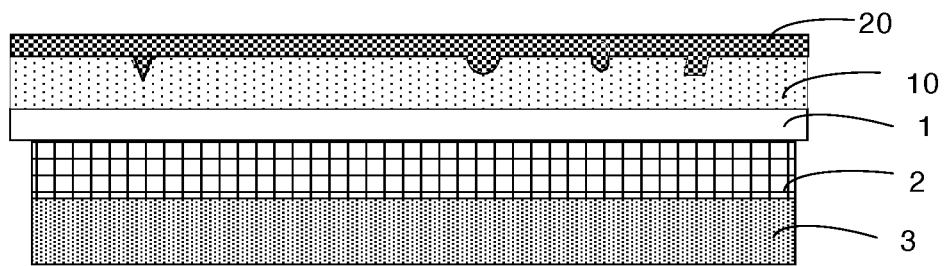
FIG. 4 is a structural schematic view of an OLED display panel after forming the planarization layer according to an embodiment of the disclosure.

After treating the step S20, the obtaining OLED display panel structure which is already planarized shown as FIG. 4. Comparing with the FIG. 1 and the FIG. 4, after coating and forming the planarization layer 20 on the surface of the glass carrier 10 which is away from the flexible substrate 1, the mechanical damage on the backside of the glass carrier 10 such as pits, scratches will disappear by filling the material of planarization layer, and the surface of the planarization layer 20 which is away from the glass carrier 10 is more flat and lower roughness.

Figure 5:
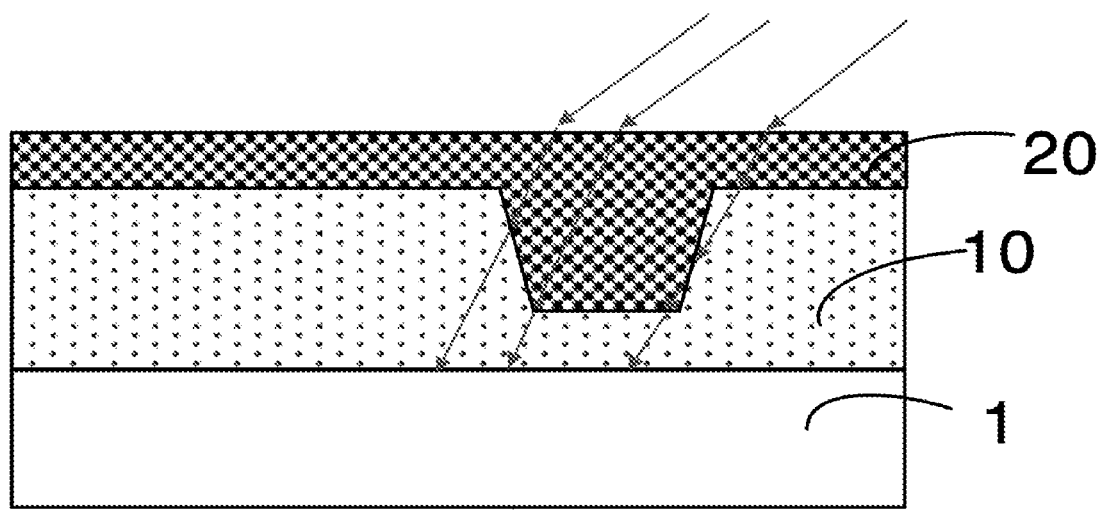
FIG. 5 is a schematic view of transmitting path of UV laser in the planarization layer, the glass substrate and the flexible substrate according to an embodiment of the disclosure.

The planarized OLED display panel, a planarization layer 20 which has flat surface is covering on the backside of the glass carrier 10, so that while laser lift-off, the laser could uniform hit on the flexible substrate (please refer to FIG. 5). It is easy to achieve separate the carrier and flexible substrate, and won't be damage the circuit, TFT array on the flexible substrate.

Selectively, during the laser lift-off, the laser wavelength is 300-400 nm; the laser energy is 290-350 mJ. In the present technology, generally using the laser energy is 260-290 mJ to the OLED display panel which is not planarized.

Selectively, in the step S30, after removing the glass carrier, further comprising a module preparing process, for example examination, reparation, washing, IC bounding.

In sum, the method of manufacturing a flexible OLED display panel of this disclosure. Before laser lift-off the OLED display panel which has glass carrier, forming the planarization layer 20 on surface of the glass carrier 10 which is away from the flexible substrate 1, so that flatting the surface of the glass carrier 10 which is away from the flexible substrate 1. While the laser lift-off, laser could uniform hitting on the flexible substrate 1, it is easy to achieve separating the glass carrier 10 and the flexible substrate 1 and won't damage the touch circuit on the flexible substrate 1. The method of manufacturing flexible OLED display panel of this disclosure could better improve the problem of the laser unevenly distributing in the flexile substrate because of the surface of glass carrier is damaged by the mechanical during the present LLO process, and enhances successful LLO process, enhances yield product of flexible OLED display panel.

Figure 6:
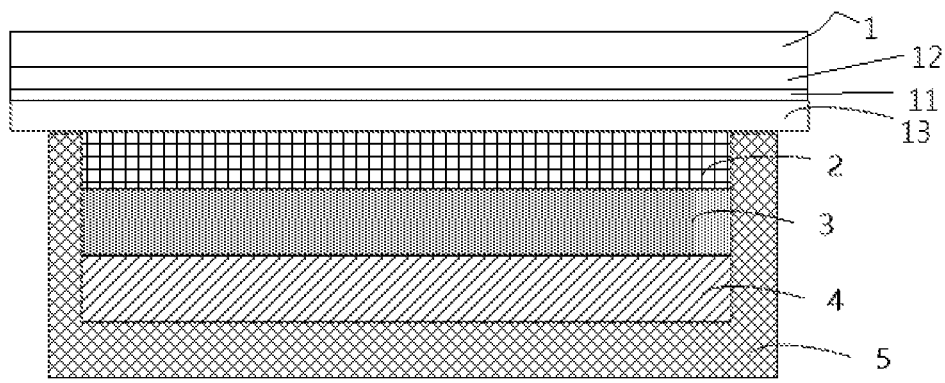
FIG. 6 is a structural schematic view of the flexible OLED display panel after LLO process according to an embodiment of the disclosure.

After laser lift-off, the flexible OLED display panel be obtained is a regulator structure of the present technology, it could not be limited by flexible substrate 1, low temperature poly-Si 2, OLED element 3 shown as FIG. 6.

Furthermore, directly preparing touch wire 11, touch sensing element on the flexible substrate; or preparing a first blocking layer 12 on the flexible substrate, and then preparing touch wire 11.

The low temperature poly-Si 2 is formed by laser crystallization to amorphous silicon, and achieve to artificial control supper horizontal growth. It also called Low Temperature Poly Silicon thin film transistor (LPST-TFT) layer, thin film transistor array (TFT array) layer. The forming polycrystalline contains less crystal boundary such that balances performance of the TFT element.

Selectively, a second blocking layer 13 is positioned between the touch wire 11 and the low temperature poly-Si 2. The first blocking layer and the second blocking layer provide the function of water blocking, and planarization.

The manufacturing method of OLED element 3 could refer to the present technologies, for example evaporation. The OLED element 3 cloud include an anode, an organic emitting layer, a cathode; the OLED element 3 also could sequentially stacking position anode, hole transparent layer, organic emitting layer, electrode transparent layer, cathode; the OLED element 3 further could sequentially stacking position anode, hole injecting layer, hole transparent layer, organic emitting layer, electrode transparent layer, electrode injecting layer, cathode and so on, but it is not limited thereto.

Wherein, sequentially forming a packaging protecting layer 4, a flexible rear cover 5 on the OLED element layer 3, the flexible substrate 1 and the flexible rear cover 5 are forming an enclosed space for accommodating the OLED element layer 3 and the packaging protecting layer 4.

Further, the packaging protecting layer 4 is encapsulating the OLED element layer 3 and the low temperature poly-Si layer 2 on the flexible substrate 1.

Further, the packaging protecting layer 4 is formed by disposing the organic film and the inorganic film alternately, the organic film and the inorganic film both have certain water blocking ability. The flexible rear cover 5 could be made by polyethylene terephthalate (PET) and so on.

The foregoing contents are detailed description of the disclosure in conjunction with specific preferred embodiments and concrete embodiments of the disclosure are not limited to these descriptions. For the person skilled in the art of the disclosure, without departing from the concept of the disclosure, simple deductions or substitutions can be made and should be included in the protection scope of the application.

What is claimed is:

1. A method of manufacturing a flexible OLED display panel, comprising
providing a glass carrier, sequentially forming a flexible substrate, a low temperature poly-Si layer and an OLED element layer on a surface of the glass carrier;
forming a planarization layer on a second surface of the glass carrier which is away from the flexible substrate and obtaining a planarized OLED display panel;
removing the glass carrier by laser lift-off the planarized OLED display panel, and obtaining the flexible OLED display panel;
sequentially forming a packaging protecting layer, a flexible rear cover on the OLED element layer, the flexible substrate and the flexible rear cover forming an enclosed space for accommodating the OLED element layer and the packaging protecting layer; and
forming a touch wire on the flexible substrate; or forming a first blocking layer on the flexible substrate, and forming the touch wire on the first blocking layer.

2. The method of manufacturing a flexible OLED display panel according to claim 1, wherein the planarization layer has laser transmittance ≥90% in 300-400 nm wavelength range.

3. The method of manufacturing a flexible OLED display panel according to claim 2, wherein the material of the planarization layer has laser absorption rate ≤6% in 300-400 nm wavelength range.

4. The method of manufacturing a flexible OLED display panel according to claim 3, wherein the roughness of the planarization layer is 0.05-0.3 μm.

5. The method of manufacturing a flexible OLED display panel according to claim 4, wherein the material of the planarization layer comprises at least one of organic material or inorganic material, the organic material comprises at least one of epoxy, acrylic resin and silicone; the inorganic material comprises at least one of silicon dioxide, magnesium fluoride, calcium fluoride and barium fluoride.

6. The method of manufacturing a flexible OLED display panel according to claim 3, wherein the material of the planarization layer comprises at least one of organic material or inorganic material, the organic material comprises at least one of epoxy, acrylic resin and silicone; the inorganic material comprises at least one of silicon dioxide, magnesium fluoride, calcium fluoride and barium fluoride.

7. The method of manufacturing a flexible OLED display panel according to claim 1, wherein the roughness of the planarization layer is Ra≤0.4 μm.

8. The method of manufacturing a flexible OLED display panel according to claim 1, wherein the thickness of the planarization layer is 50-120 μm.

9. The method of manufacturing a flexible OLED display panel according to claim 8, wherein the thickness of the glass carrier is 400-500 μm.

10. The method of manufacturing a flexible OLED display panel according to claim 9, wherein the planarization layer and the glass carrier which are stacking positioned have laser transmittance ≥40% in 300-400 nm wavelength range.

11. The method of manufacturing a flexible OLED display panel according to claim 10, wherein the material of the planarization layer comprises at least one of organic material or inorganic material, the organic material comprises at least one of epoxy, acrylic resin and silicone; the inorganic material comprises at least one of silicon dioxide, magnesium fluoride, calcium fluoride and barium fluoride.

12. The method of manufacturing a flexible OLED display panel according to claim 11, wherein the material of the planarization layer is silicon dioxide.

13. The method of manufacturing a flexible OLED display panel according to claim 11, wherein the step of forming the planarization layer which is mixing the material of the planarization layer and a solvent to obtain a sizing mixture; coating the sizing mixture on the second surface of the glass carrier which is away from the flexible substrate; and curing to form the planarization layer.

14. The method of manufacturing a flexible OLED display panel according to claim 1, wherein the material of the planarization layer comprises at least one of organic material or inorganic material, the organic material comprises at least one of epoxy, acrylic resin and silicone; the inorganic material comprises at least one of silicon dioxide, magnesium fluoride, calcium fluoride and barium fluoride.

15. The method of manufacturing a flexible OLED display panel according to claim 14, wherein the step of forming the planarization layer which is mixing the material of the planarization layer and a solvent to obtain a sizing mixture; coating the sizing mixture on the second surface of the glass carrier which is away from the flexible substrate; and curing to form the planarization layer.

16. The method of manufacturing a flexible OLED display panel according to claim 1, wherein during the laser lift-off, the laser wavelength is 300-400 nm; the laser energy is 290-350 mJ.

17. The method of manufacturing a flexible OLED display panel according to claim 1, wherein the packaging protecting layer encapsulating the OLED element and the low temperature poly-Si layer on the flexible substrate; the packaging protecting layer is formed by disposing an organic film and an inorganic film alternately.

18. The method of manufacturing a flexible OLED display panel according to claim 1, further comprising a second blocking layer positioned between the touch wire and the low temperature poly-Si layer.

* * * * *